United States Patent [19]
Flynn

[11] Patent Number: 5,521,562
[45] Date of Patent: May 28, 1996

[54] HIGH ISOLATION SWITCH

[75] Inventor: Stephen J. Flynn, Dunure, Scotland

[73] Assignee: Cambridge Computer Limited, Scotland

[21] Appl. No.: 162,168

[22] PCT Filed: Jun. 15, 1992

[86] PCT No.: PCT/GB92/01064

§ 371 Date: May 2, 1994

§ 102(e) Date: May 2, 1994

[87] PCT Pub. No.: WO92/22937

PCT Pub. Date: Dec. 23, 1992

[30] Foreign Application Priority Data

Jun. 14, 1991 [GB] United Kingdom .................. 9112907

[51] Int. Cl.$^6$ .................................................. H01P 1/15
[52] U.S. Cl. .................................. 333/104; 330/295
[58] Field of Search .................................. 333/103, 104; 307/243, 571; 330/295; 327/408, 409

[56] References Cited

U.S. PATENT DOCUMENTS

| 4,472,691 | 9/1984 | Kumar et al. | 333/103 |
| 4,731,594 | 3/1988 | Kumar | 333/103 |
| 4,803,443 | 2/1989 | Tagaki et al. | 330/295 X |
| 4,810,911 | 3/1989 | Noguchi | 307/571 |
| 4,959,873 | 9/1990 | Flynn et al. | 327/408 X |

OTHER PUBLICATIONS

Levy et al., A Broadband Hybrid Active Switchable Combiner, 15th European Microwave Conference Proceedings, 9–13 Sep. 1985 pp. 629–634.

*Primary Examiner*—Paul Gensler
*Attorney, Agent, or Firm*—Gifford, Krass, Groh, Sprinkle, Patmore, Anderson & Citkowski

[57] ABSTRACT

A switch for transmitting a signal with gain from one of a plurality of input transmission lines (10A,10B,10N) to a common output line (14) is described which achieves high isolation by omitting the transmission line between the output matching section and the junction of the input and the output. In one embodiment the output of each amplifier, a field effect transistor (38,40), is coupled directly to a common output (34) and the output matching circuitry is also omitted from the input lines, there being provided a common output matching and bias network located in the output line. In another embodiment the output matching network (26a, 26b;64a,64b) is coupled directly to the common junction (16;56) and the transmission line length between the output matching network and the junction is omitted for each input line.

3 Claims, 1 Drawing Sheet

HIGH ISOLATION SWITCH

The present invention relates to a high isolation switch and, particularly, but not exclusively, to a FET switch for transmitting a signal with gain from one of a plurality of input transmission lines to a common output line.

In a switch in which a single output line is switched to one or more input lines, it is desirable that the switch performs such that cross channel isolation complies with the highest possible standards or projected standards. At the present in the United States a cross channel isolation standard of 27 dB. has been proposed and this is over the frequency range 11.7–12.2 GHz. This means that when one polarization is on and the other polarization is off, the isolation between polarizations is at least 27 dB.

A transmission line switch is disclosed in published UK Patent Application No. GB2220538A to Marconi which allows a single output line to be switched to one or more input lines to which it is permanently connected at a common junction. In the switch disclosed in this application each input line has an associated amplifier stage which can be biased in a normal high gain (on) state, or in an isolation (off) state. The biasing is selected so that when the amplifier is biased in the off state it ensures that the amplifier stage output presents a low impedance to its own input line, the length of which is selected to achieve a high impedance at the junction with the other lines. In the transmission line switch disclosed in the aforementioned application the low output impedance presented by an amplifying device which is a field effect transistor, in its off state can be transformed into a high impedance at the junction by choosing a suitable length of transmission line. It is stated in this document that when the length L of the line is chosen appropriately the wanted signal at the junction preferentially follows a low impedance path which is the output line and signal loss to the off input line or lines is minimized. It is also stated that this device was found to provide a greater attenuation of unwanted signal when operated with a low output impedance than when operated with a high output impedance. In any event, it is critical to this invention that the high impedance achieved at the junction is only obtained by combining the output impedance of the amplifying means together with an appropriate length of transmission line.

The disclosed transmission line switch provides isolation of about 20 dB over 10.95–11.70 GHz. between polarizations and does not meet the proposed U.S. standards which limits the application of such a device. In addition, the requirement of a portion of transmission line between the amplifying means and the switch increases the switch size and adds to costs. This is significant when board area is limited.

An object of the present invention is to provide an high isolation switch which obviates or mitigates at least one of the aforementioned disadvantages.

This is achieved, in one aspect, by omitting the transmission line between the output matching section and junction of the input and the output.

The output matching network is coupled directly to the common junction and the transmission line length between the output matching network and the junction is omitted for each input line.

In another aspect of the invention, the biasing of the amplifiers is changed so that when the field effect transistor is normally off it is biased off in the reverse pinch-off direction, so that the output impedance of the off amplifying means is high and, consequently, the length of the transmission line to the common junction avoids the use of a nominal quarter wavelength line so that the high impedance appears in the off leg of the junction providing an effective open circuit to the on-path. The cross channel isolation achieved with the inventive embodiments herein above described is at least 30 dBs. (and in fact 40 dBs has been demonstrated across the frequency range 10.95–12.2 GHz. in comparison to the circa 20 dB. obtainable with the Marconi device.

According to a further aspect of the present invention there is provided a high isolation switch arrangement in which at least two input lines are connected to a common output line at a common junction, each input line having an input matching and bias network and the output of the input matching and bias network being connected to the input of amplifying means provided by a single-gate field effect transistor (FET), the output of the FET being coupled to the input of an output matching network, and the output of the output matching network being connected to said common junction, each FET being biased such that one of two or more inputs on said input lines can be switched to the common output, the FET being biased "on" to provide high gain or "off" to provide isolation, and in the off state biasing is such that the FET is pinched "off" whereby the transistor provides high impedance at its output to allow the "on" and "off" paths to be joined at the common junction with minimal loss introduced into the "on" path.

The output matching networks may include biasing means. In one arrangement a length of transmission line without a quarter wavelength section is connected between each output matching and bias network and the common junction, each length of transmission line including d.c. blocking means, whereby the on-FET may be biased to provide a positive voltage on the output and the off FETs biased to provide a zero or minimal voltage on the output. This biasing arrangement results in extremely good signla isolation.

This arrangement offers very high "on" to "off" isolation, in fact over 30 dBs. has been achieved over the frequency range 10.90–12.2 GHz. This is much higher than the isolation obtained by running the "off" transistor open channel as disclosed in the Marconi document, which results in low impedance at the output. In addition, this arrangement does not require the use of a nominal quarter wavelength transmission line to transform the low impedance to a high impedance at the junction.

Preferably, the field effect transistor is a high electron mobility transistor (HEMT). The high electron mobility transistor provides gain in the "on" state and high isolation in the "off" state.

According to another aspect of the present invention there is provided a method of isolating a signal passing through an input line with gain from other input lines which are off, said method comprising steps of providing at least two input lines coupled to a common junction, and an output line also coupled to said common junction, each of said input liens having; a matching and bias network; amplifying means coupled to the output of said input matching and bias network, and an output matching and bias network, the output matching and bias network in each input line being coupled to said common junction, whereby the amplifier of the input line which is switched to the common output is biased "on" to provide high gain and the amplifiers in the other input lines are biased to pinch-off to provide isolation.

This method avoids the use of nominal quarter wavelength transmission line to transform the impedance to an open circuit at the junction.

These and other aspects of the invention will become apparent from the following description when taken in combination with the accompanying drawings in which.

Figure 1:
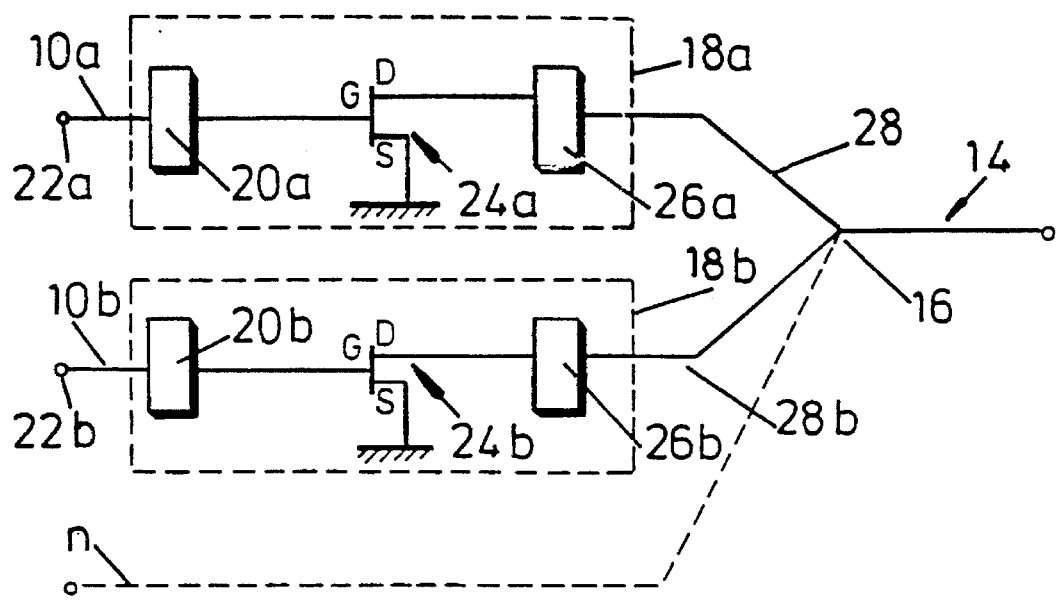
FIG. 1 is a schematic diagram of an improved high isolation switch in accordance with a first embodiment of the present invention.

Reference is first made to FIG. 1 of the drawings which depicts a first embodiment in which in a plurality of input transmission lines, 10A, 10B, . . . N are shown connected to a common output line 14 at a common junction 16. Each input line is identical. For reasons of clarity only two input lines 10A and 10B are shown in detail and only one input line (A) will be described although it will be understood that the description will be applicable to all other input lines (B, C etc.) and like numerals will refer to like parts. The input line 10 consists of an amplifying means generally indicated by reference numeral 18 which includes an input matching and bias network 20 which is coupled to first input 22. The output of the input matching and bias network 20 is connected to the gate (G) of a field effect transistor (FET) 24, the source(s) of which is connected to ground. The output of the FET 24 is taken from the drain (D) and this forms the input to an output matching and bias network 26, the output of which is connected to the common junction 16 via a section of transmission line 28. The length of transmission line 28 is zero or a multiple of half wavelength sections and does not require the use of a nominal quarter wavelength section to transform the impedance to an open circuit at the junction 16 as will be later described in detail. One of the inputs 22A, 22B to 22N can be switched to the common output 14 by the correct biasing of the field effect transistors 24A, 24B etc. Each amplifier 24A, 24B can be biased "on" to provide high gain or "off" to provide isolation. The "off" isolation state is achieved by correctly biasing the FET 24A to 24B to pinch off. When this happens the transistor which is biased "off" provides a high impedance at the output terminal which is the drain. This allows the "on" path and the "off" path to be joined at the junction 16 with minimal loss introduced to the "on" path.

In the embodiment shown, if the input line 10A is switched to common output line 14, then the field effect transistor 24A is biased "on". Therefore, the remaining field effect transistors 24B etc. are biased to pinch off and this results in the high impedance at the output drain terminal D of the transistors. Thus, this impedance is transformed to the junction 16 and the signal travelling on input line 10 sees an extremely high impedance presented by the remaining "off" input lines. With this arrangement very high "on" to "off" isolation is achieved. Over 30 dB. has been achieved over the frequency range 10.9–12.2 GHz. This is significantly higher than isolation obtained by running the off transistor open channel with a low impedance at the output as disclosed in the prior art. This also does not require the use of a nominal quarter wavelength transmission line to transform the impedance to an open circuit at the junction 16.

It will be appreciated that the field effect transistor may be implemented as a high electron mobility transistor (HEMT) device to provide gain in the "on" state and high isolation in the "off" state and also by any other suitable device.

Figure 2:
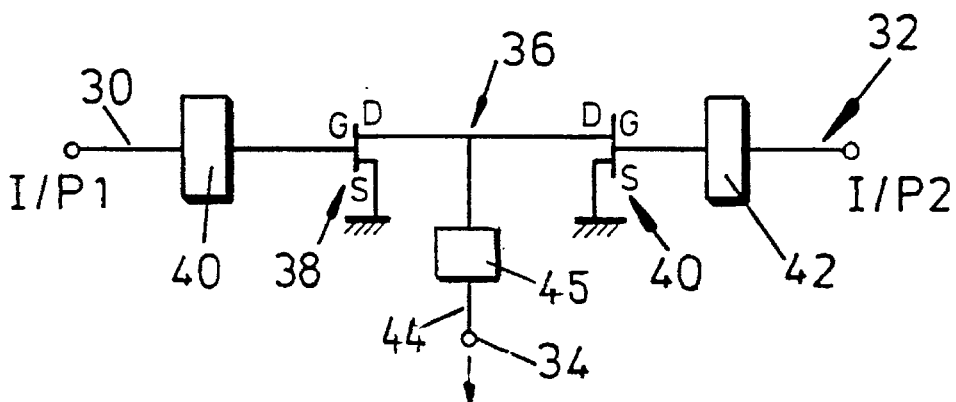
FIG. 2 is a schematic diagram of a second embodiment of a high isolation line switch in accordance with the present invention.

Reference is not made to FIG. 2 of the drawings which depicts an alternative embodiment of an improved transmission line switch in which only two input channels 30 and 32 are shown connected to the common output 34 by a common junction 36 to which are directly connected the drain terminals of the field effect transistors 38, 40. Input lines 1 and 2 have respective input matching circuits 40, 42 respectively and the outputs of these input matching circuits are connected to the gates of field effect transistors 38 and 40 respectively. In this embodiment the output matching circuit in each input line has been removed and the output of the field effect transistors, the drain terminals are connected directly together at junction 36. Thus there is also no output transmission line between the drain terminals and the output. The output transmission line 44 includes an output matching and bias network 45 to achieve maximum gain from the "on" amplifier. The biasing of the field effect transistors 38 and 40 is carried out in the same way as before, that is, in the "on" state the transistor is biased on to provide high gain and in the "off" state the transistor is reverse biased to saturation or pinch off so that the output impedance of the "off" transistor is relatively high relative to the characteristic impedance of the output line. For example, in this case if a signla was being received on input line 1, then transistor 38 is biased "on" and transistor 40 is biased to pinch off to provide isolation and the signal travelling along input 1 effectively sees the other input line as open circuit.

Figure 3:
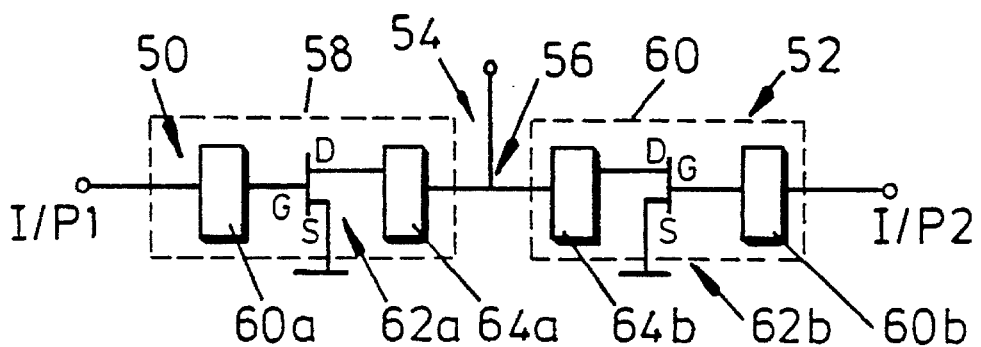
FIG. 3 is a third embodiment of a high isolation switch in accordance with the present invention.

Reference is now made to a further embodiment as shown in FIG. 3 of the drawings in which 2 input lines 50 and 52 are shown connected to a common output line 54 via a common junction 56. Each input line 50, 52 is identical and only two are shown for clarity, although it will be appreciated that a plurality of such input lines could be coupled to junction 56. Each line includes a signal amplifying means generally indicated by reference numerals 58, 60. Each amplifier means consists of a input matching network 60A, 60B connected to FETS 62A, 62B the outputs of which, the drains are coupled to respective output matching and bias network 64A, 64B. In this case the output of each amplifying means is joined directly to the junction 56 and there is no section of transmission line or length of transmission line connected between the output of the matching means 64 and the junction 56. The operation of the transmission line switch is as described above. When one line is switched to receive a signal, for example, on the input 1, the transistor 62A is biased "on" and the transistor 62B is reverse biased "off" to pinch off such that the impedance which appears at the junction 56 is extremely high and appears to the signal travelling at input 1 to be open circuit, thus the isolation between the input carrying the desired signal and the other input lines is high.

The advantages of the aforementioned embodiments are that the omission of the transmission line means that there is no length of line required to transform the impedance which results in a smaller board area which is important for reasons of size and is also less expensive to manufacture. In each described embodiment driving the transistor to pinch off in the "off" lines results in a much higher isolation than has previously been achieved by the aforementioned prior art being of the order of 30 dB. or the like over a frequency range of 10.90–12.2 GHz., thus meeting the anticipated U.S. requirements of 27 dB isolation between channels. The biasing arrangement can be used with the embodiment of FIG. 1 which includes a length of transmission line (0, λ/2 or N λ/2), but without a λ/4 section) connected between the output of each line and the common junction. Inclusion of a d.c. block in each transmission line allows the on amplifier to have an output of 2–3 volts and the off amplifier to have an output of 0V to provide the necessary signal isolation.

Furthermore, in some embodiments a length of transmission line is not required at the output because a high impedance is achieved at the output of the amplifying means. In some embodiments there is no requirement to have a D.C. block in the output line as the drain terminals of all FETs can be left at the same potential, thus simplifying manufacture and minimizing cost.

The switch hereinbefore described has applications in receiver front ends, notably DBS receivers.

I claim:

1. A high isolation switch arrangement in which at least two input lines are connected to a common output line at a common junction, each input line having an input matching and bias network and the output of the input matching and bias network being connected to the input of an amplifying means provided by a single-gate field effect transistor (FET), the output of the FET being coupled to the input of an output matching network, and the output of the output matching network being connected to said common junction via a transmission line having a length equal to zero or a multiple number of half wavelengths of a signal being transmitted, each FET being biased such that one of two or more inputs on said input lines can be switched to the common output, each FET being switchable between an 'on' and an 'off' position, so that a FET biased 'on' provides high gain and when biased 'off' provides isolation and in the off state biasing is such that the FET is pinched 'off' whereby when one FET is biased 'on', the other FET or FETs are 'off', the 'on' FET and the output matching circuit provide high gain at the junction whilst the 'off' FET or FETs and respective output matching circuits provide a very high impedance at the common junction to a signal in the 'on' path so that minimal loss is introduced to said signal in the 'on' path.

2. A switch as claimed in claim 1 wherein the output matching networks include biasing means.

3. A switch as claimed in claim 1 wherein the field effect transistor is a high electron mobility transistor (HEMT) and which provides gain in the "on" state and high isolation in the "off" state.

* * * * *